(12) United States Patent
Tarsa et al.

(10) Patent No.: US 7,804,147 B2
(45) Date of Patent: Sep. 28, 2010

(54) LIGHT EMITTING DIODE PACKAGE ELEMENT WITH INTERNAL MENISCUS FOR BUBBLE FREE LENS PLACEMENT

(75) Inventors: Eric Tarsa, Goleta, CA (US); Thomas C. Yuan, Ventura, CA (US); Maryanne Becerra, Santa Barbara, CA (US); Praveen Yadev, Goleta, CA (US)

(73) Assignee: Cree, Inc., Goleta, CA (US)

( * ) Notice: Subject to any disclaimer, the term of this patent is extended or adjusted under 35 U.S.C. 154(b) by 421 days.

(21) Appl. No.: 11/496,918

(22) Filed: Jul. 31, 2006

(65) Prior Publication Data

US 2008/0026498 A1 Jan. 31, 2008

(51) Int. Cl.
*H01L 31/0203* (2006.01)
*H01L 31/0232* (2006.01)
*H01L 31/00* (2006.01)
*H01L 51/00* (2006.01)
*H01L 33/00* (2006.01)

(52) U.S. Cl. .................. 257/433; 257/434; 257/432; 257/431; 257/E51.018; 257/E51.02; 257/E33.073

(58) Field of Classification Search ......... 257/431–435, 257/51.018, E51.02, E33.073
See application file for complete search history.

(56) References Cited

U.S. PATENT DOCUMENTS 4,152,044 A 5/1979 Liu (Continued)

FOREIGN PATENT DOCUMENTS

EP 0936682 8/1999

(Continued)

OTHER PUBLICATIONS

The Second Office Action from People's Republic of China, re: China Application No. 200480027969.2, Date: Jul. 04, 2008.

(Continued)

*Primary Examiner*—Luan C Thai
(74) *Attorney, Agent, or Firm*—Koppel, Patrick, Heybl & Dawson

(57) ABSTRACT

A method for fabricating a light emitting diode (LED) package comprising providing an LED chip and covering at least part of the LED chip with a liquid encapsulant having a radius of curvature. An optical element is provided having a bottom surface with at least a portion having a radius of curvature larger than the liquid encapsulant. The larger radius of curvature portion of the optical element is brought into contact with the liquid encapsulant. The optical element is then moved closer to the LED chip, growing the contact area between said optical element and said liquid encapsulant. The liquid encapsulant is then cured. A light emitting diode comprising a substrate with an LED chip mounted to it. A meniscus ring is on the substrate around the LED chip with the meniscus ring having a meniscus holding feature. An inner encapsulant is provided over the LED chip with the inner encapsulant having a contacting surface on the substrate, with the meniscus holding feature which defines the edge of the contacting surface. An optical element is included having a bottom surface with at least a portion that is concave. The optical element is arranged on the substrate with the concave portion over the LED chip. A contacting encapsulant is included between the inner encapsulant and optical element.

21 Claims, 4 Drawing Sheets

U.S. PATENT DOCUMENTS

| | | | |
|---|---|---|---|
| 4,675,575 | A | 6/1987 | Smith et al. |
| 5,477,436 | A | 12/1995 | Bertling et al. |
| 6,046,464 | A | 4/2000 | Schetzina |
| 6,274,890 | B1* | 8/2001 | Oshio et al. .................... 257/98 |
| 6,330,111 | B1 | 12/2001 | Myers |
| 6,331,915 | B1 | 12/2001 | Myers |
| 6,340,824 | B1* | 1/2002 | Komoto et al. ................ 257/99 |
| 6,504,301 | B1* | 1/2003 | Lowery ...................... 313/512 |
| 6,657,393 | B2 | 12/2003 | Natsume |
| 6,746,889 | B1 | 6/2004 | Eliashevich et al. |
| 6,784,463 | B2 | 8/2004 | Camras et al. |
| 6,932,497 | B1 | 8/2005 | Huang |
| 7,029,935 | B2* | 4/2006 | Negley et al. ................. 438/29 |
| 7,084,435 | B2* | 8/2006 | Sugimoto et al. ............. 257/99 |
| 7,087,936 | B2 | 8/2006 | Negley |
| 7,326,583 | B2* | 2/2008 | Andrews et al. .............. 438/26 |
| 2002/0015013 | A1 | 2/2002 | Ragle |
| 2002/0054495 | A1 | 5/2002 | Natsume |
| 2003/0015708 | A1 | 1/2003 | Parikh et al. |
| 2003/0085409 | A1 | 5/2003 | Shen et al. |
| 2004/0079957 | A1 | 4/2004 | Andrews et al. |
| 2004/0207313 | A1 | 10/2004 | Omoto et al. |
| 2005/0077535 | A1 | 4/2005 | Li |
| 2005/0117320 | A1 | 6/2005 | Leu et al. |
| 2005/0152127 | A1 | 7/2005 | Kamiya et al. |
| 2005/0173692 | A1 | 8/2005 | Park et al. |
| 2005/0173728 | A1 | 8/2005 | Saxler |
| 2006/0081862 | A1 | 4/2006 | Chua et al. |
| 2006/0097245 | A1* | 5/2006 | Aanegola et al. .............. 257/26 |
| 2006/0158899 | A1 | 7/2006 | Ayabe et al. |
| 2006/0180925 | A1* | 8/2006 | Lee et al. .................... 257/717 |
| 2006/0220046 | A1 | 10/2006 | Yu et al. |
| 2007/0090383 | A1 | 4/2007 | Ota et al. |
| 2007/0278512 | A1* | 12/2007 | Loh et al. ..................... 257/99 |
| 2008/0036364 | A1 | 2/2008 | Li et al. |
| 2008/0074032 | A1 | 3/2008 | Yano et al. |

FOREIGN PATENT DOCUMENTS

| | | |
|---|---|---|
| EP | 0936682 A | 8/1999 |
| EP | 1349202 A | 1/2003 |
| EP | 1653255 | 5/2006 |
| EP | 1681509 | 7/2006 |
| FR | 2586844 | 3/1987 |
| FR | 2759188 | 8/1998 |
| FR | 2814220 | 3/2002 |
| WO | WO9856043 | 12/1998 |
| WO | 02011212 A | 7/2002 |
| WO | 03044870 | 5/2003 |
| WO | WO03080763 | 10/2003 |
| WO | WO05104247 | 11/2005 |
| WO | 2007005844 A | 11/2007 |

OTHER PUBLICATIONS

International Search Report for PCT/US2008/004453, Date: Sep. 9, 2008.
Written Opinion for PCT/US2008/004453, Date: Sep. 9, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
Notice Requesting Submission of Opinion re related Korean Application No. 10-2004-7001033, dated: Mar. 9, 2009.
Sakai et al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.
Zhang AP et al., "Comparison of GAN P-I-N and Schottky Rectifier Performance" IEEE Transactions on Electron Devices, IEEE Inc. New York, US, vol. 48, No. 3, pp. 407-411, Mar. 2001.
European Search Report, Feb. 24, 2009, re related European Application No. EP 08253301.
Notice Requesting Submission of Opinion re related Korean application No. 10-2004-7001033, dated: Mar. 9, 2009.
Zhang et al. "Comparison of GaN P-I-N and Schottky Rectifier Performance", IEEE Transactions on Electron Devices, vol. 48, No. 3, Mar. 2001, pp. 407-411.
Sakai et al., "Experimental Investigation of Dependence of Electrical Characteristics on Device Parameters in Trench MOS Barrier Schottky Diodes", 1998, International Symposium on Power Semiconductor Devices & ICs, Kyoto, pp. 293-296.
European Search Report re related European Application No. 08253301.9-2222. Feb. 24, 2009.
European Search Report re related EP Appl. 08160129.6.2222, Dated: Dec. 15, 2008.
Asbeck at al."Enhancement of Base Conductivity Via the Piezoelectric Effect in AlGaN/GaN HBTs", Solid State Electronics, Elsevier Science Pub. Barking GB, vol. 44, No. 2, Feb. 1, 2000 pp. 211-219, XP004186190.
Johnson et al."New UV Light Emitter Based on AlGaN Heterostructures with Graded Electron and Hole Injectors", Materials Research Society Symposium—Proceedings 2002 Materials Research Society US, vol. 743, 2002, pp. 481-486.
Simon et al. "Polarization-Induced 3-Dimensional Electron Slabs in Graded AlGaN Layers", Materials Research Society Symposium Proceedings 2006 Materials Research Society US, vol. 892, Nov. 28, 2005, pp. 417-422.
Official Notice of Final Decision of Rejection re related Japanese Patent Appl. No. 2003-529535, Dated: Jan. 6, 2009.
European Communication from related European Appl. 02 798 906.0-1235, Dated Feb. 6, 2009.
Notice of First Office Action from related China Patent Application No. 200710142217.6, dated: Jun. 22, 2009.
Copending U.S. Appl. No. 11/443,741, filed Jun. 14, 2007.
Copending U.S. Appl. No. 11/685,761, filed Mar. 13, 2007.
Copending U.S. Appl. No. 11/939,059, filed Nov. 13, 2007.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
U.S. Appl. No. 11/613,692, filed Dec. 20, 2006, Negley et al.
U.S. Appl. No. 11/614,180, filed Dec. 21, 2006, Negley.
U.S. Appl. No. 11/624,811, filed Jan. 19, 2007, Negley et al.
U.S. Appl. No. 11/743,754, filed May 3, 2007, Van De Van.
U.S. Appl. No. 11/751,982, filed. May 22, 2007, Negley et al.
U.S. Appl. No. 11/753,103, filed May 24, 2007, Negley et al.
U.S. Appl. No. 11/751,990, filed May 22, 2007, Negley.
U.S. Appl. No. 11/755,153, filed May 30, 2007, Negley et al.
U.S. Appl. No. 11/856,421, filed Sep. 17, 2007, Van De Ven.
U.S. Appl. No. 11/859,048, filed Sep. 21, 2007, Van De Ven et al.
U.S. Appl. No. 11/939,047, filed Nov. 13, 2007, Negley.
U.S. Appl. No. 11/963,163, filed Nov. 7, 2007, Van De Ven et al.
U.S. Appl. No. 11/843,243, filed Aug. 22, 2007, Van De Ven et al.
U.S. Appl. No. 11/939,052, filed Nov. 13, 2007, Pickard et al.
U.S. Appl. No. 11/736,799, filed Apr. 18, 2007, Van De Ven et al.
U.S. Appl. No. 11/877,038, filed Oct. 23, 2007, Trott et al.
U.S. Appl. No. 11/870,679, filed Oct. 11, 2007, Negley.
U.S. Appl. No. 11/948,041, filed Nov. 30, 2007, Trott et al.
U.S. Appl. No. 11/949,222, filed Dec. 3, 2007, Negley.
U.S. Appl. No. 12/174,053, filed Jul. 16, 2008, Negley et al.
U.S. Appl. No. 12/002,429, filed Dec. 4, 2007, Loh et al.
U.S. Appl. No. 12/045,729, filed Mar. 11, 2008, Roberts et al.
U.S. Appl. No. 11/818,818, filed Jun. 14, 2007, Chakraborty et al.
European Search Report from related European Application No. 07254498.4, received on Feb. 11, 2010.
The Second Office Action from People's Republic of China, re: China Application No. 200480027969.2, Date: Jul. 4, 2008.

* cited by examiner

LIGHT EMITTING DIODE PACKAGE ELEMENT WITH INTERNAL MENISCUS FOR BUBBLE FREE LENS PLACEMENT This invention was made with Government support under government contact National Energy Technology Laboratory (NETL), Contract No. DE-FC26-05NT42340. The Government has certain rights in this invention

BACKGROUND OF THE INVENTION

1. Field of the Invention

This invention relates to semiconductor light emitting diodes (LED or LEDs) and more particularly to LED packages with optical elements.

2. Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED. The useful light is generally emitted in the direction of the LED's top surface.

LEDs are often arranged in packages that can include a molded or cast plastic body that encapsulates an LED chip, a lens, and conductive traces or leads. Heat is typically generated by LEDs when power is applied and they are emitting light. The traces or leads serve as a conduit to supply the LED chip with electrical power and can also serve to draw heat away from the LED chip. In some packages, a portion of the lead frame extends out of the package for connection to circuits external to the lead frame package.

LED packages typically have some type of encapsulant surrounding the LED chip to enhance light extraction from the chip and protect the chip and related contacts structure (e.g. wire bonds) from exposure to physical damage or environmental conditions which could lead to corrosion or degradation. The lens can have a hemispherical shape and can be mounted to the package by the encapsulant. The lens can serve as an optical element to enhance light extraction from the package and in some instances, to provide output light beam shaping by controlling the angle-dependent emission properties of the lamp.

Present surface-mount LED package technology typically utilizes either a separate glass lens or a molded silicone lens. For surface mount packages, which typically require high temperature (200-300° C.) solder reflow processing to attach the LED package to its final fixture, the possible lens materials typically include silicones and glasses. These lenses are piecepart molded using known processes and are then affixed to the LED package. These lens materials can also have a different coefficient of thermal expansion (CTE) compared to the surrounding package components. This can result in the cracking or delaminating of the LED chip or package elements, both of which can reduce light extraction from the LED package. This difference in CTE can also result in damage to the LED chip, and in particular the wire bond can be broken or pulled from the LED. This can result in failure of the LED package.

U.S. Patent Application Publication No. 2004/0079957 to Loh discloses an LED package utilizing a "floating lens" concept in which a solid hemispherical lens is located above the LED chip and is attached to the package by a silicone encapsulant. It includes a reflector plate that functions as a heat sink to conduct heat away from the LED chip and has reflective surfaces to direct light from the LED chip in the desired direction. Further, lateral forces can be applied to the lens during fabrication, installation, or operation, and to reduce this problem the reflective plate is also designed with retention features to constrain lateral motion of the lens. The lens is also allowed to "float" in the vertical direction, moving up and down in response to expansions and contractions through thermal cycles. This allows stress in the silicone encapsulant arising from thermal expansion of the encapsulant to be reduced, thereby reducing the chance for tearing of delamination.

These packages typically use a solid hemispherical lens with a substantially flat or planar surface. The lens is mounted above the LED chip to allow clearance for the LED chip wire bonds, which requires that the LED chip be placed below the origin of the hemisphere. Further, for the reflective plate's retention features to retain the lens against lateral forces may be necessary for a retaining feature to rise above the bottom surface and surround the lower portion of the lens. In the package described in U.S. Patent Application Publication No. 2004/0079957 to Loh, the hemispherical lens sits within a recessed lip of the reflector plate.

For various cost and fabrication reasons, this retaining feature is typically not transparent to light but rather is reflective. This arrangement can result in some of the light emitted by the LED chip being lost due to loss mechanisms such as total internal reflection. Further, because the LED chip sits below the bottom surface of the hemispheric lens, additional reflective surfaces are required to direct sideways emitted LED light to the lens and out the package. This reflection process is not 100% efficient, resulting in additional loss of light. Also, reflections from these surfaces effectively creates a larger, more complex light source (compared, for example, to the chip alone) which can require more complex secondary optics that can result in additional light loss.

The hemispherical lens with a substantially flat or planar surface can also result in bubbles of air being trapped between the lens and the encapsulant during the fabrication step in which the lens is attached to the package. These bubbles can result in decreased light extraction from the LED package and variations in light emitting characteristics between different packages.

SUMMARY OF THE INVENTION

One embodiment of a method for fabricating a light emitting diode (LED) package according to the present invention comprises providing an LED chip and covering at least part of the LED chip with a liquid encapsulant having a radius of curvature. An optical element is provided having a bottom surface with at least a portion having a radius of curvature larger than the liquid encapsulant. The larger radius of curvature portion of the optical element is brought into contact with the liquid encapsulant. The optical element is then moved closer to the LED chip, growing the contact area between the optical element and the liquid encapsulant. The liquid encapsulant is then cured.

One embodiment of a light emitting diode (LED) package according to the present invention comprises a substrate with an LED chip mounted to it. A meniscus ring is located on the substrate around the LED chip with the meniscus ring having a meniscus holding feature. An inner encapsulant is provided over the LED chip with the inner encapsulant having a contacting surface on the substrate. The meniscus holding feature defines the edge of the contacting surface. An optical element is included having a bottom surface with at least a portion that is concave. The optical element is on the substrate with the concave portion over the LED chip. A contacting encapsulant is included between the inner encapsulant and optical element.

Another embodiment of a light emitting diode (LED) package according to the present invention comprises an LED chip and a cured encapsulant over the LED chip. An optical element is included having a bottom surface, with the bottom surface on the cured encapsulant with substantially no air trapped between the two. The optical element is placed on the encapsulant prior to curing. The encapsulant prior to curing has a radius of curvature and the bottom surface having at least a portion with a radius of curvature larger than the encapsulant's radius of curvature. The bottom surface brought into contact with the encapsulant prior to curing, and moved toward the LED chip pushing out air as the contact area between the two grows.

One embodiment of a light emitting diode (LED) array package according to the present invention comprises a substrate with a plurality of LED chips mounted to it so that electrical signals applied to the substrate are conducted from the substrate to the LED chips. An inner encapsulant is provided over each of the LED chips and the inner encapsulant has a contacting surface on the substrate. An optical element is included over each of the LED chips with each optical element having a bottom surface with at least a portion that is concave. The concave portion of each lens is over its LED chip, and a contacting encapsulant is between said each inner encapsulant and its optical element.

These and other aspects and advantages of the invention will become apparent from the following detailed description and the accompanying drawings which illustrate by way of example the features of the invention.

DETAILED DESCRIPTION OF THE INVENTION

Figure 1:
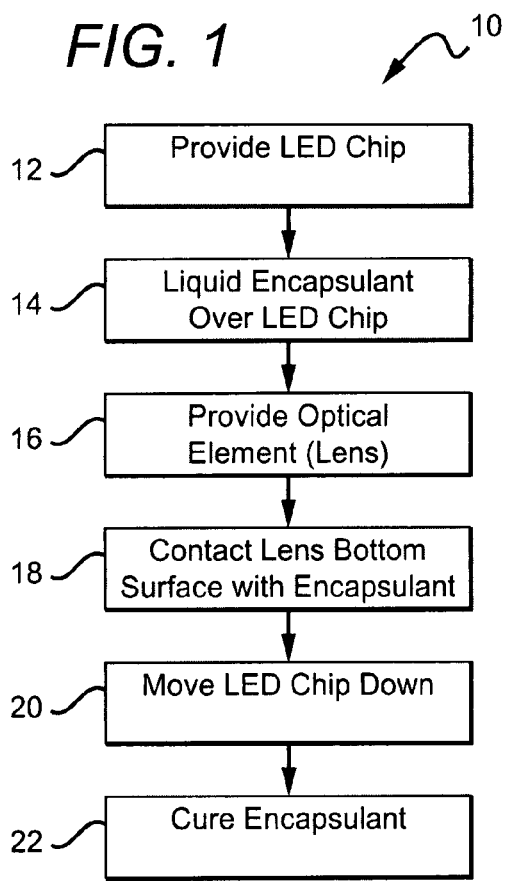
FIG. 1 is a flow diagram for one embodiment of a method for forming an LED package according to the present invention.

The present invention generally relates to a method of fabricating a semiconductor device package and packages fabricated using the method. The present invention is particularly applicable to an LED package having an element mounted over the device by an adhesive/encapsulant ("encapsulant"). The element is preferably an optical element (e.g. lens) mounted over an LED chip prior to curing of the encapsulant when it is in liquid form. The lens and liquid encapsulant are arranged and mounted together to minimize the formation of bubbles between the two during package fabrication.

In one embodiment of an LED package the lens comprises a hemispherical lens having a hollow or concave portion. A meniscus feature holds the liquid encapsulant in a substantially hemispheric shape that allows bubble free, reproducible, placement of the lens over the liquid encapsulant. A lens retention feature can be included to provide mechanical stability to the lens, and a "submount" can be included with sufficient height to raise the chip relative to the lens retention feature and internal meniscus feature. These features allow improved optical placement of the LED chip in the package, resulting in a compact, simplified optical source and improved light extraction from the package. The simple compact optical source can allow less expensive, simpler secondary optical elements to be used with the package, and improve overall light efficiency. The use of an internal meniscus ring improves the manufacturability of the package, facilitating the placement of the hollow lens without bubble entrapment.

Assembly of one embodiment of an LED package according to the invention is carried out as follows: first, an LED chip is bonded to the substrate. A meniscus ring, which contains both a lens retention feature and an internal meniscus forming feature, is bonded to the substrate or may be otherwise formed directly in the substrate, for example, by a molding process, plating process, or other forming process. A suitable inner encapsulant, such as a silicone elastomer material is dispensed into the region surrounding the LED chip such that a meniscus of the encapsulant is formed on the internal meniscus forming feature. This inner encapsulant is then cured, and a second contacting encapsulant is applied to the now cured inner encapsulant. The lens is then placed over the LED chip in a manner in which the highest point of the second contacting material contacts the lens first. As pressure is applied to the lens during placement, and it moves closer to the LED chip, the contact point grows and becomes a circle, which expands in a manner such that air is pushed out and not entrapped during lens placement.

One added benefit of the initial meniscus formed at the internal meniscus forming feature is that the cured meniscus determines or controls the height of the lens relative to the chip and this cured meniscus may be readily measured to provide accurate manufacturing control over the final height at which the lens resides in relation to the remainder of the package. This helps ensure good manufacturing control over both the stress in the encapsulant material following assembly and during thermal cycling (determined in part by the amount of lens float) and the optical properties of the final package (e.g. output beam full-width at half maximum or FWHM) that can be partially determined by the relative positions of the origin of the lens and LED chip. For simplicity or cost reasons, it may be desirable to eliminate the curing step for the meniscus and place the lens directly on the uncured first meniscus material. This approach may not have all the benefits of lens height control, but could result in lower manufacturing costs.

The present invention is described herein with reference to certain embodiments but it is understood that the invention can be embodied in many different forms and should not be construed as limited to the embodiments set forth herein. It is also understood that when an element such as a layer, region or substrate is referred to as being "on" another element, it can be directly on the other element or intervening elements may also be present. Furthermore, relative terms such as "inner", "outer", "upper", "above", "lower", "beneath", "below" and "overlies", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 1 shows one embodiment of a method 10 for fabricating an LED package according to the present invention. Although the method 10 is described with reference to an LED package, it is understood that the method can be used to fabricate other semiconductor device packages. It is further understood that although the method 10 is shown as a series of steps, the step can occur in different order and different steps can be employed.

In 12 an LED chip is provided. Many different LED chips can be provided and more than one LED chip can be provided. In one embodiment, the LED chip is provided that has been mounted to a substrate such as a surface mount substrate, although other substrates can also be used and the substrates can be made of many different materials. Surface mount substrates are known in the art and only briefly discussed herein. In one embodiment, the surface mount substrate can comprise a ceramic core with conductive features deposited on surfaces of the core. The conductive features can comprise traces made of a conductive material such as plated copper that are deposited using known techniques. The surface mount substrate is arranged to be mounted to a final fixture using solder reflow processes known in the art.

In 14 a liquid encapsulant is provided over the LED chip and in one embodiment the encapsulant has a shape with a certain curvature or radius of curvature. In an embodiment with the LED chip on a surface mount substrate the encapsulant is preferably provided in a substantially hemispheric shape over the LED chip with the encapsulant having a substrate contacting surface. To assist in forming this shape, a meniscus holding feature or meniscus ring can be included on the substrate, around the LED chip. Meniscus forming features generally comprise a physical transition that is arranged so that a meniscus forms by surface tension between a liquid and the physical transition. The term "meniscus" refers to the convex surface of liquid which is formed by surface tension. The physical transitions can be features such as edges, corners, ledges, trenches, rings, and any other physical transition that creates a meniscus when a liquid surface comes in contact with it. Further, the meniscus forming feature can be defined solely, or in part, be a chemical boundary—for example a boundary across which the surface energy changes such that a meniscus may be formed along the edges of the boundary. The meniscus holding features are primarily described herein as rings, but it is understood that the meniscus holding features can have many different shapes such as square or oval with these shapes influencing the overall shape of the liquid held by the feature. As the liquid encapsulant is provided over the LED chip the meniscus between the encapsulant and meniscus ring holds the encapsulant in a substantially hemispheric shape over the LED chip.

In other embodiments, the liquid encapsulant can be provided as a contacting encapsulant dispensed on an already cured inner encapsulant. The inner encapsulant is provided over the LED chip and held in a substantially hemispheric shape by the meniscus holding feature. It is then cured and the contacting encapsulant is dispensed.

In 16 an optical element is provided that can have many different shapes and sizes. In one embodiment the optical element comprises a lens having a substantially hemispheric shape and a bottom surface. The bottom surface has a portion with a radius of curvature larger than the radius of curvature of the liquid encapsulant. In one embodiment, the back surface can be flat, while in other embodiments the back surface of the lens can have a portion with curve such that the back surface is concave making the lens at least partially hollow. The bottom surface curve can be in different locations but is preferably near the center of the bottom surface.

In 18 the bottom surface of the lens is brought into contact with the liquid encapsulant over the LED chip, and preferably the highest point of the liquid encapsulant is brought into contact at approximately the center of the back surface. In the embodiments where the bottom surface has a concave portion on the bottom surface, the liquid encapsulant contacts the lens in the concave portion. In step 20, downward pressure is applied to the lens and the lens is moved toward the LED chip. The contact point between the lens and liquid encapsulant grows and expands outward in a circle. Because the lens' back surface has a larger radius of curvature than the liquid encapsulant, the contact area grows while minimizing trapped air that can form bubbles. For the embodiments where the back surface is at least partially concave, a portion of the LED chip in the final LED package can reside at or above the bottom surface of the lens, within the concave portion. This brings the LED chip closer to the origin in hemispheric shaped lenses. In step 22, the liquid encapsulant is cured to bond the lens to the encapsulant. Different known curing methods can be used such as heat or UV curing.

In different embodiments of a method according to the present invention, meniscus rings with different features or more than one meniscus ring can be used. In one embodiment the meniscus ring can comprise a lens retention feature to retain the lens so it is not easily damaged or dislodged in response to lateral forces on the lens. The encapsulant and lens can comprise light conversion materials, such as phosphors, and can also comprise scattering particles. Different LED packages fabricated using methods according to the present invention can have different components and can have different intermediate cured encapsulants.

Figure 2:
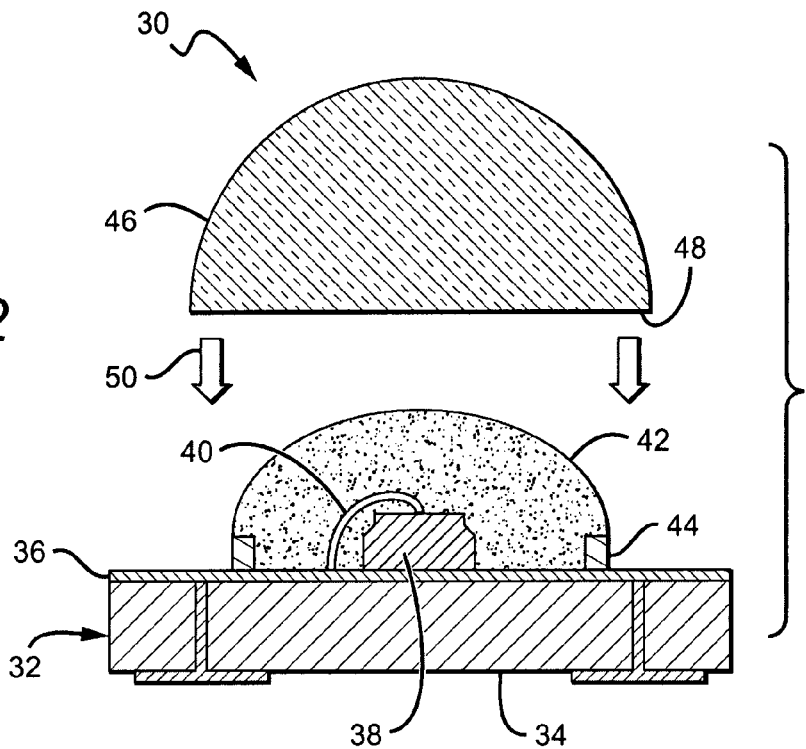
FIG. 2 is sectional view of one embodiment of an LED package according to the present invention at one fabrication step.

FIG. 2 shows one embodiment of an LED package 30 according to the present invention at a fabrication step in a method according to the present invention. The package 30 comprises a substrate or submount 32 that can be many different substrates but is preferably a surface mount substrate as described above with a ceramic core 34 and conductive features 36 deposited on surfaces of the core.

The package 30 also comprises an LED chip 38 mounted to the substrate 32 using known mounting methods, and in other embodiments more than one LED chip can be included. The details of operation and fabrication of conventional LED chips are generally known in the art and are only briefly discussed. Conventional LED chips can be fabricated by known methods, with a suitable method being fabrication by Metal Organic Chemical Vapor Deposition (MOCVD). In operation, an electrical signal can be applied across the LED's oppositely doped layer causing the LED's active region to emit light.

In the LED package 30, the LED chip 38 is in electrical contact with the conductive features 36 such that a bias applied to the conductive features 36 is conducted to the LED chip 38, causing it to emit light. It is understood that the LED chip 38 can be in electrical contact with the substrate using different arrangements depending on factors such as the LED chip geometry and layout of the conductive features 36. It is further understood that in other embodiments according to the present invention, the LED chip is not in electrical contact with the substrate. In the embodiment shown, the LED chip 38 is contacted by a wire bond 40 and through its back surface contacting the substrate's conductive features 36.

A liquid encapsulant 42 is provided over the LED chip 38 and is preferably formed in a substantially hemispheric shape over the LED chip 38. A meniscus ring 44 can be included on the substrate, around the LED chip 38 to hold the encapsulant 42 in its hemispheric shape. In other embodiments, the inner material can be held in its hemispheric shape by surface tension between the top of the substrate 32 and the liquid encapsulant. The encapsulant 42 can comprise many different materials alone or in combination, with a suitable material being a curable silicone or epoxy. The meniscus ring 44 provides a physical transition that allows for the formation of a meniscus between it and the liquid encapsulant. It is understood that other physical transitions can be used and in different shapes. The meniscus ring can be made of many different materials including heat conductive, reflective and/or transparent materials.

The encapsulant 42 can also comprise light conversion materials, such as phosphors. In one embodiment according to the present invention the LED chip 38 emits light in the blue wavelength spectrum and the phosphor absorbs some of the blue light and re-emits yellow. The LED package 30 emits a white light combination of blue and yellow light. A full range of broad yellow spectral emission is possible using conversion particles made of phosphors based on the $(Gd,Y)_3(Al,Ga)_5O_{12}$:Ce system. The following lists other suitable phosphors used as conversion particles in an LED package 30, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:$Eu^{2+}$
$Ba_2(Mg,Zn)Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$: Eu
$Ba_2SiO_4$:$Eu^{2+}$ Red
$Lu_2O_3$:$Eu^{3+}$ $(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$, $Ga^{3+}$
$CaAlSiN_3$:$Eu^{2+}$
$Sr_2Si_5N_8$:$Eu^{2+}$ The conversion materials can have different concentrations in the encapsulant 42 depending on the conversion efficiency of the material. The conversion particles can be uniformly dispersed in the inner material, or the particles can settle around the LED so that the particles are closer to the LED. The encapsulant 42 can also contain materials to help scatter the light, such as scattering particles.

The package 30 also comprises a lens 46 that can be made of many different materials such as silicones, epoxies or glass, and is preferably formed having a substantially hemispheric shape. As described above, the portion of the lens back surface 48 that contacts the encapsulant 42 should have a radius of curvature larger than the hemispheric shape of the encapsulant 42. The contacting portion 48 of the lens 46 is flat, but can have many different shapes according to the present invention. The lens can contact the encapsulant in different locations, but preferably contacts it at or near the center of the lens' back surface. During the fabrication process the lens 46 is moved toward the encapsulant 42 in the direction shown by first arrows 50.

Figure 3:
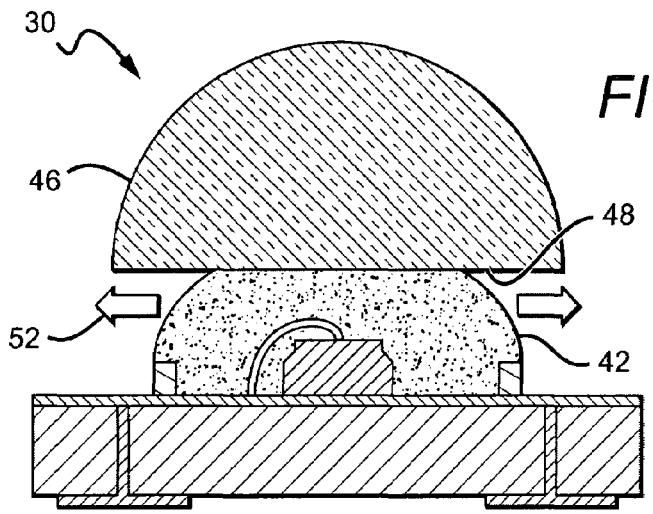
FIG. 3 is a sectional view of the LED package in FIG. 2 at another fabrication step.
Figure 4:
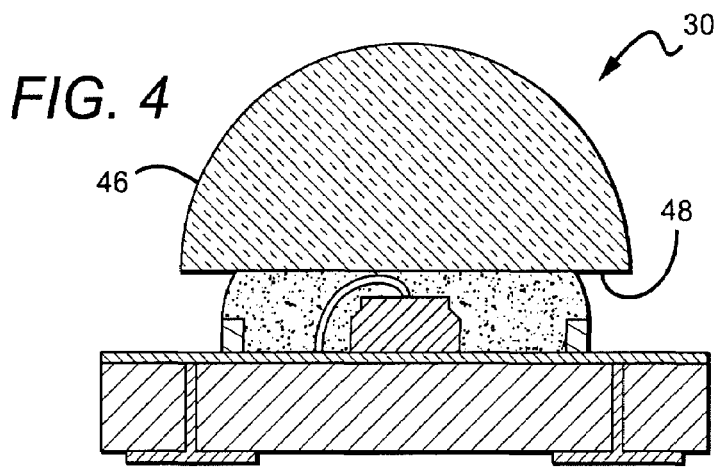
FIG. 4 is a sectional view of the LED package in FIG. 2 at another fabrication step.

Referring now to FIG. 3, the LED package 30 is shown at another step in a fabrication method according to the present invention. FIG. 3 uses the same reference numerals for the same features in FIG. 2 with the understanding that the description of those features above applies to the features herein. The back surface of the 48 of lens 46 is shown in contact with the liquid encapsulant 42 and in a preferred embodiment the highest point of the encapsulant contacts the back surface of the lens, near the center. As the lens 46 moves further down, the contact area between the liquid encapsulant and portion expands out in the direction as illustrated by second arrows 52. By expanding out as shown, the lens is brought in contact with the encapsulant with trapped air bubbles being minimized or eliminated. In FIG. 4, LED package is shown at another step in the fabrication process where the bottom surface 48 of the lens 46 is shown in full contact with the encapsulant and the encapsulant can now be cured.

Figure 5:
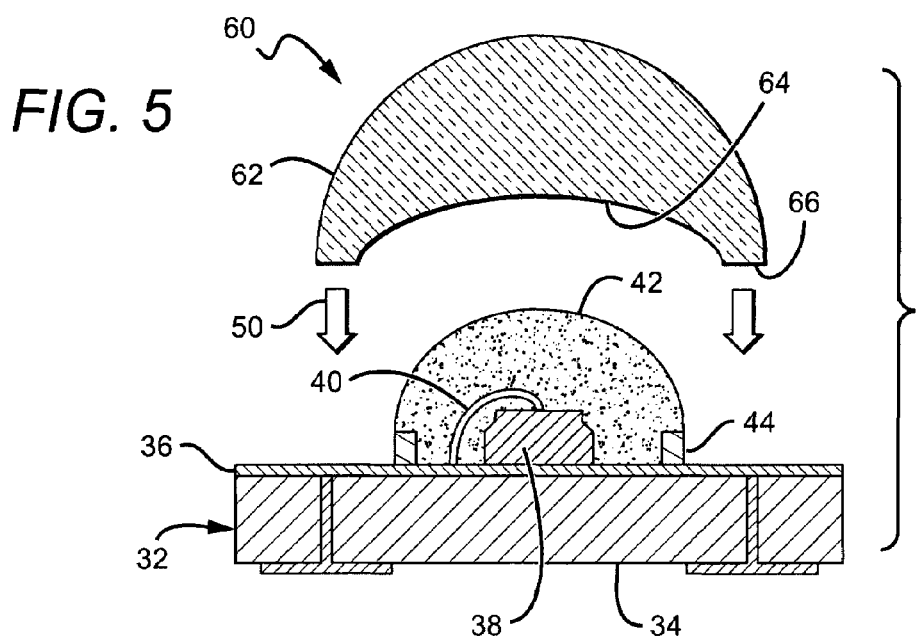
FIG. 5 is a sectional view of another embodiment of an LED package according. to the present invention at one fabrication step.
Figure 6:
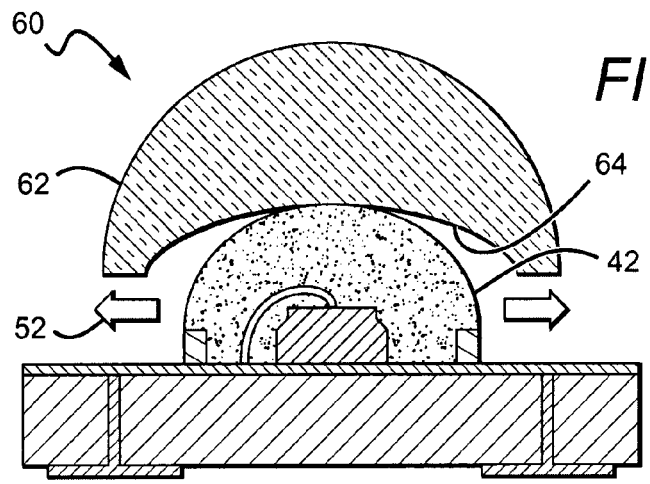
FIG. 6 is a sectional view of the LED package in FIG. 5 at another fabrication step.
Figure 7:
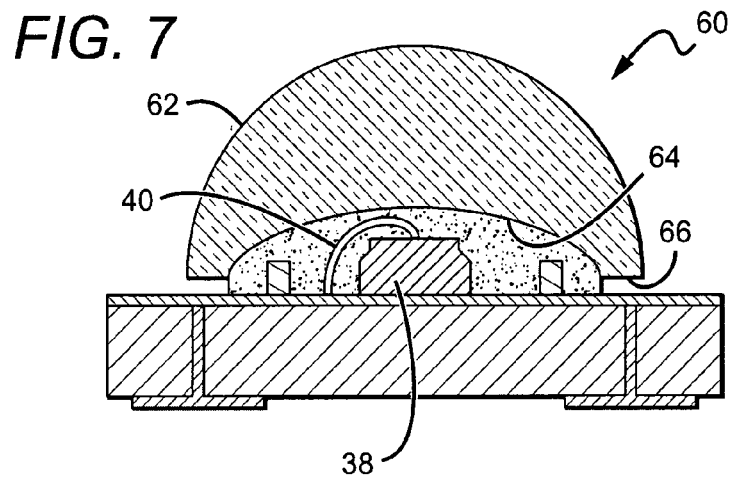
FIG. 7 is a sectional view of the LED package in FIG. 5 at another fabrication step.

FIGS. 5-7 show another embodiment of an LED package according 60 to the present invention having many similar elements to those in LED package 30 in FIGS. 2-4. For those similar elements, the same reference numerals are used herein and in the figures below. The package 60 comprises a substrate 32 with a ceramic core 34 and conductive features 36. An LED chip 38 is mounted to the substrate 32 and is contacted to the substrate's conductive features 36 through its back surface and wire bond 40. A meniscus ring 44 is mounted to the substrate 32 and a liquid encapsulant 42 is provided over the LED chip 38 in a hemispheric shape. A meniscus is formed between the encapsulant 42 and ring 44 that helps hold the encapsulant 42 in its hemispheric shape.

The package 60 further comprises a lens 62 that can be made of the same materials as the lens 46 in FIGS. 2-4. The lens 62, however, has a concave portion 64 at its back surface 66 that preferably has a larger radius of curvature than the liquid encapsulant 42. The concave portion 64 can be in many different locations, but is preferably at or near the center of the lens' back surface. During fabrication, the lens 46 is moved toward the liquid encapsulant in the direction shown by first arrows 50. In FIG. 6, the lens' concave portion 64 is shown in contact with the liquid encapsulant 42. In a preferred embodiment, the highest point of the liquid encapsulant 42 contacts approximately the highest point of the concave portion 64. As the lens 62 is moved further down, the contact area between the encapsulant 42 and the concave portion 64 expands out as shown by second arrows 52, thereby reducing or eliminating trapped air bubbles.

FIG. 7 shows the concave portion 64 in full contact with the liquid encapsulant 42 at which point the encapsulant 42 can be cured. The concave portion can have different sizes, but is preferably sized so that at least a potion of the wire bond 40 and LED chip 38 is above the back surface 66 of the lens 62 and within the concave potion 64. This places the LED chip closer to the origin of the lens, which provides certain light emission advantages. More of the emitted light passes directly into the lens without the need for additional reflectors. Less of the light is lost due to total internal refraction, and the package provides and improved emission profile.

Figure 8:
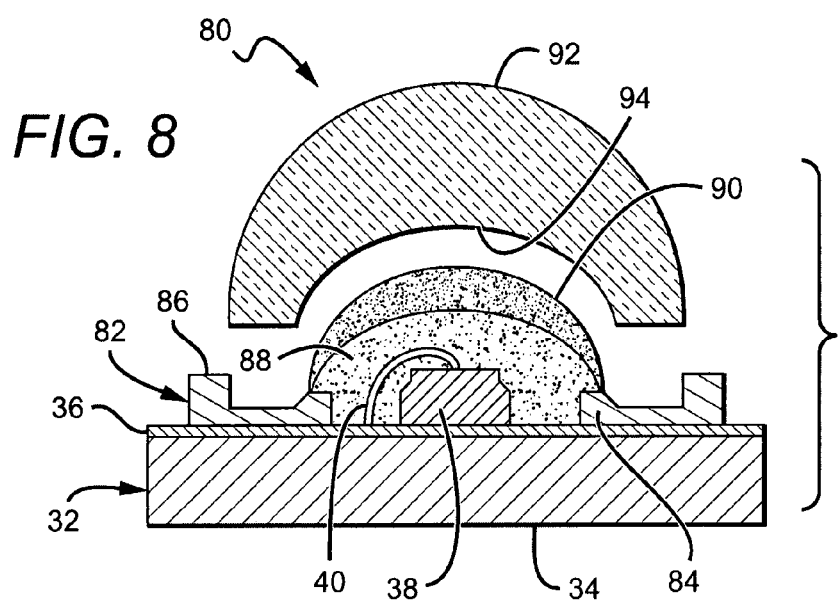
FIG. 8 is a sectional view of still another embodiment of an LED package according to the present invention at one fabrication step.

FIG. 8 shows still another embodiment of an LED package 80 according to the present invention comprising a substrate 32 with a core 34 and conductive features 36. An LED chip 38 is mounted to the substrate 32 and is contacted to the substrate 32 through its back surface and wire bond 40. A meniscus ring 82 is mounted to the substrate 32, around the LED chip 38 with the ring 82 having a meniscus holding feature 84 and a lens retention feature 86. The meniscus and lens retention features 84, 86 are shown as part of one meniscus holding ring 82, but they can be provided as separate structures. The meniscus ring 82 preferably forms a circle around the LED chip 38, but it is understood that the ring 82 can have many different shapes around the LED chip 38. A first dispensed material or inner encapsulant 88 is dispensed over the LED chip 38 with a meniscus forming between the inner encapsulant 88 and the inner meniscus holding feature. The meniscus holds the inner encapsulant 88 in a hemispheric shape and the inner encapsulant 88 is cured. Many different materials can be used for the inner encapsulant 88, with a suitable material being a silicone elastomer material.

A second dispensed material or contacting encapsulant 90 can then be dispensed over the cured inner encapsulant 88. The package further comprises a lens 92 having a concave section 94 that is preferably near the center of the lens' back surface and has a radius of curvature larger than the inner encapsulant 88 with its contacting encapsulant 90. During fabrication, the lens 92 is moved down and the concave section contacts the contacting encapsulant 90. As the lens moves further down, the contact area between the two becomes a circle that expands outward. The circle expands such that trapped air between the lens 92 and second dispensed material 90 is minimized or eliminated. The inner encapsulant 88 and contacting encapsulant 90 can be made of the same or different materials, with suitable materials for both being silicones or epoxies.

Figure 9:
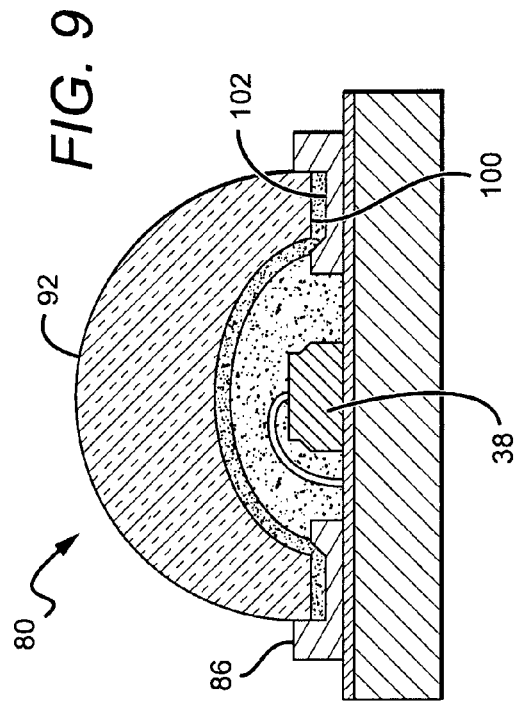
FIG. 9 is a sectional view of the LED package in FIG. 2 at another fabrication step.

FIG. 9 shows the LED package 80 after the lens 92 has been moved down over the LED chip 38 to the desired position. The lens bottom surface 100 is held within the lens retaining feature 86. with the bottom surface 100 on or near the lateral surface 102 of the meniscus ring 82 such that the bottom surface 100 is lower than the top of the retaining feature 86. This arrangement helps hold the lens 92 over the LED chip 38 such that the lens 92 is not easily damaged or dislodged from the LED package 80 when subjected to lateral forces. This arrangement also results in the LED chip 38 being at above the bottom surface of the lens 92. In embodiments where the lens bottom surface is substantially flat the LED chip 38 is below the lens and a higher meniscus ring needs to be included to provide the necessary space between the lens 92 and LED chip. The lens 92 and meniscus ring 82 arrangement allows for the LED chip 38 to be at least partially above the bottom surface 100 closer to the origin of the lens. This provides light emission efficiency advantages described above. Further, because the LED chip 38 does not need to be below the lens' bottom surface 100, a lower meniscus ring can be used, which further reduces emission efficiency losses. The package can also compensate for differences in coefficient of thermal expansion (CTE) mismatches between the lens 92 and the remainder of the package, by allowing the lens to "float" up and down within the meniscus ring retaining feature 86 during thermal cycles.

Figure 10:
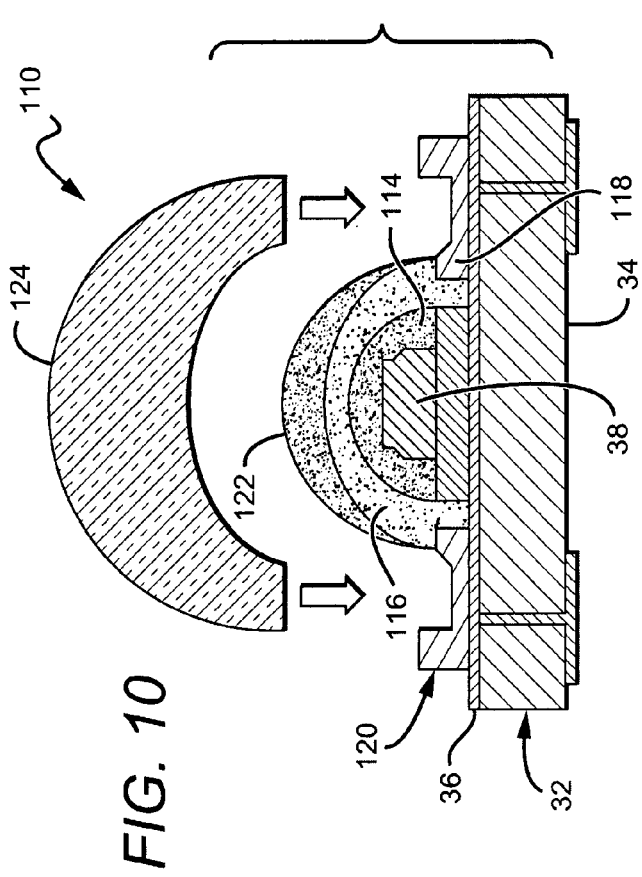
FIG. 10 is a sectional view of another embodiment of an LED package according to the present invention.

Many different versions of LED packages according to the present invention are possible and different encapsulant combinations can be used. FIG. 10 shows another embodiment of an LED package 110 according to the present invention comprising a substrate 32 with a core 34 and conductive features 36. An LED chip 38 can be mounted to a submount 112 that is then mounted to the substrate 32. The LED package 110, however, does not have a wire bond. The LED chip 38 comprises two bottom contacts that are electrically coupled to the conductive features 36. This arrangement is particularly applicable to lateral geometry LED chips that can be flip chip mounted to the substrate. Each of the embodiments described herein can comprise an LED chip contacted to the substrate and its conductive features without wire bonds.

The package 110 may be designed such that first encapsulant 114 may be dispensed in the vicinity of the LED chip 38 with the encapsulant 114 forming a meniscus on with the submount 112 (or chip) and cured. A second (inner) encapsulant 116 is dispensed over the first encapsulant 114 and forms a meniscus at the internal meniscus forming feature 118 of the meniscus ring 120. This can be followed by a third (contacting) encapsulant 122 to attach the lens 124. This arrangement allows for the use of materials that are most well suited for each of the locations in the package.

Figure 11:
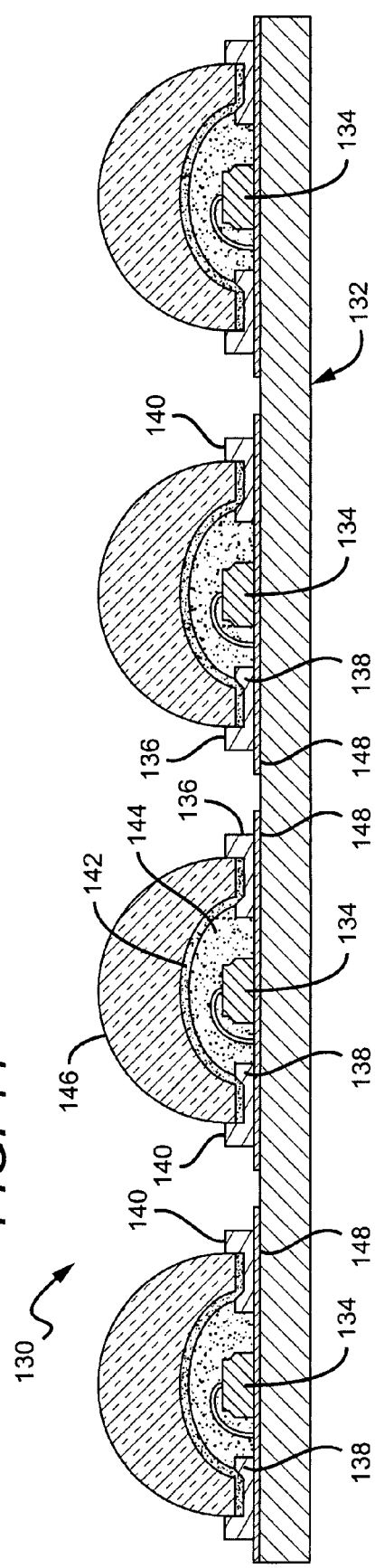
FIG. 11 is a sectional view of one embodiment of an LED array according to the present invention.

The present invention can also be used in forming LED arrays and FIG. 11 shows one embodiment of an LED array 130 according to the present invention. By combining many meniscus rings on a single substrate each with their own LED chip(s) and/or submount(s), arrays can be fabricated using the basic concepts of this invention. The LED array 130 generally comprises a substrate 132 with a plurality of LED chips 134 each of which is mounted in electrical contact with the substrate 132. Each also has a meniscus ring 136 with inner meniscus holding feature 138 and lens retention feature 140. Each also has a first inner encapsulant 142, second contacting encapsulant 144, and lens 146, all arranged similar to elements in LED package 80 shown in FIGS. 8 and 9 above. The substrate can have conductive traces 148 to apply an electrical signal to each of the LED chips, and in some embodiments the LED chips can emit the same or different colors and intensities of light. The LED array 130 is shown with one row of four LED chips 134, but it is understood that the LED array 130 can have many rows of LED chips, and each of the rows can have fewer or more LED chips 134.

Although the present invention has been described in detail with reference to certain preferred configurations thereof, other versions are possible. Therefore, the spirit and scope of the invention should not be limited to the versions described above.

We claim:
1. A light emitting diode (LED) package, comprising:
a substrate with an LED chip mounted to it;
a meniscus forming feature on said substrate around said LED chip, said meniscus forming feature comprising an edge defined by the intersection of an upper surface of said meniscus forming feature opposite said substrate and a side surface of said meniscus forming feature facing away from said LED chip;

an inner encapsulant over said LED chip and having a contacting surface on said substrate, said meniscus forming feature defining the edge of said contacting surface;

an optical element having a bottom surface with at least a portion that is concave, said optical element on said substrate with said concave portion over said LED chip; and a contacting encapsulant between said inner encapsulant and said optical element.

2. The LED package of claim 1, wherein said optical element comprises a substantially hemispheric lens.

3. The LED package of claim 1, wherein said LED chip is at least partially within said concave portion of said optical element.

4. The LED package of claim 1, wherein the inner encapsulant has a radius of curvature and said optical element concave portion has a radius of curvature, said concave portion having a larger radius of curvature than said inner encapsulant.

5. The LED package of claim 1, wherein there is substantially no air trapped between said optical element and said contacting encapsulant.

6. The LED package of claim 1, wherein said meniscus forming feature further comprises an optical element retention feature.

7. A light emitting diode (LED) package, comprising:
an LED chip;
a meniscus forming feature disposed around said LED chip, said meniscus forming feature comprising an edge defined by the intersection of an upper surface of said meniscus forming feature and a side surface of said meniscus forming feature facing away from said LED chip;
an encapsulant over said LED chip; and
an optical element with a bottom surface, said bottom surface having at least a portion with a radius of curvature larger than a radius of curvature of said encapsulant prior to curing, said bottom surface arranged to conformally contact an exposed surface of said encapsulant such that substantially no air is trapped between the two.

8. The LED package of claim 7, wherein said bottom surface of said optical element comprises a concave portion, said LED chip at least partially within said concave portion.

9. The LED package of claim 7, wherein said optical element is a substantially hemispheric lens.

10. The LED package of claim 7, further comprising a substrate, said LED chip mounted to said substrate.

11. The LED package of claim 7, wherein said encapsulant is held in a substantially hemispheric shape by said meniscus forming feature prior to curing.

12. The LED package of claim 7, wherein said encapsulant comprises an inner encapsulant and a contacting encapsulant, said inner encapsulant held in a substantially hemispheric shape by said meniscus forming feature prior to curing and said contacting encapsulant being on said inner encapsulant.

13. The LED package of claim 7, wherein said meniscus forming feature further comprises an optical element retention feature.

14. A light emitting diode (LED) array package, comprising:
a substrate with a plurality of LED chips;
an inner encapsulant over each of said LED chips, said inner encapsulant having a contacting surface on said substrate;
a meniscus forming feature on said substrate around each of said LED chips, said meniscus forming feature comprising an edge defined by the intersection of an upper surface of said meniscus forming feature opposite said substrate and a side surface of said meniscus forming feature facing away from said LED chip;
an optical element over each of said LED chips, each optical element having a bottom surface with at least a portion that is concave, with said concave portion over said LED chip; and
a contacting encapsulant between each said inner encapsulant and said optical element associated therewith.

15. The LED array package of claim 14, wherein said LED chips are mounted to said substrate so that electrical signals applied to said substrate are conducted from said substrate to said LED chips.

16. The LED array package of claim 14, wherein each said meniscus forming feature has a meniscus holding feature defined by an edge of each said inner encapsulant contacting surface.

17. The LED array package of claim 14, wherein each of said LED chips is at least partially within said concave portion of its said optical element.

18. The LED array package of claim 14, wherein the inner encapsulant has a radius of curvature and said optical element concave portion has a radius of curvature, said concave portion having a larger radius of curvature than said inner encapsulant.

19. The LED array package of claim 14, wherein substantially no air is trapped between each said optical element and its said contacting encapsulant.

20. The LED array package of claim 16, wherein said meniscus forming feature further comprises an optical element retention feature.

21. The LED package of claim 1, wherein said inner encapsulant extends over at least a portion of said upper surface of said meniscus forming feature.

* * * * *